(12) United States Patent
Bojarczuk, Jr. et al.

(10) Patent No.: US 6,894,338 B2
(45) Date of Patent: May 17, 2005

(54) RARE EARTH METAL OXIDE MEMORY ELEMENT BASED ON CHARGE STORAGE AND METHOD FOR MANUFACTURING SAME

(75) Inventors: Nestor A. Bojarczuk, Jr., Poughkeepsie, NY (US); Eduard Albert Cartier, Leuven (BE); Supratik Guha, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 10/042,181

(22) Filed: Jan. 11, 2002

(65) Prior Publication Data

US 2003/0134438 A1 Jul. 17, 2003

(51) Int. Cl.⁷ ............................................. H01L 27/108
(52) U.S. Cl. ........................ 257/310; 257/296; 257/314
(58) Field of Search ................................ 257/296, 310, 257/314, 315

(56) References Cited

U.S. PATENT DOCUMENTS 6,504,214 B1 * 1/2003 Yu et al. ..................... 257/347
2002/0115252 A1 * 8/2002 Haukka et al. .............. 438/240
2002/0137317 A1 * 9/2002 Kaushik et al. ............. 438/585
2002/0142536 A1 * 10/2002 Zhang et al. ................ 438/216
2002/0151142 A1 * 10/2002 Callegari et al. ........... 438/287
2002/0164850 A1 * 11/2002 Gnadinger et al. ......... 438/211

OTHER PUBLICATIONS

Chon et al. "Fatigue free samarium–modified bismuth titanate film capacitors having large spontaneous polarizations", Nov. Applied Physics Letters , vol. 79 No. 10 pp. 3137–3139.*

U.S. Appl. No. 09/913,723 filed Aug. 17, 2001 entitled "Microelectric Device for Storing Information and Method Thereof."

* cited by examiner

Primary Examiner—Van Thu Nguyen
Assistant Examiner—Brad Smith
(74) Attorney, Agent, or Firm—Richard M. Ludwin, Esq.; McGinn & Gibb, PLLC

(57) ABSTRACT

A data storage element (and method of forming the same) includes a substrate comprising a semiconductor material, a metal oxide layer including an electrically insulating rare earth metal oxide disposed upon a surface of the substrate, a conductive material disposed upon the metal oxide layer, a first electrode electrically connected to the conductive material, and a second electrode connected to the substrate.

33 Claims, 4 Drawing Sheets

RARE EARTH METAL OXIDE MEMORY ELEMENT BASED ON CHARGE STORAGE AND METHOD FOR MANUFACTURING SAME

BACKGROUND OF THE INVENTION

1. Field of the Invention

The present invention generally relates to a memory element, and more particularly to a rare earth metal oxide memory element based on charge storage and method for manufacturing the same.

2. Description of the Related Art

In conventional semiconductor structures, when a voltage ramp is applied to a structure having a metal film interposed between two electrodes, beyond a threshold voltage, there is an accumulation of charge in the metal film, giving rise to a shift in the current voltage and capacitance voltage characteristics. Upon reversal of this voltage, beyond a certain threshold, the charge in the film is discharged, leading to the original I-V (current voltage) and C-V (capacitance voltage) requirements being restored.

However, there is a need for a non-volatile memory where the charging voltage requirements are low (<7V), charge retention times are long, and the processing technology is compatible with standard CMOS processing such as aluminum metallurgy. Prior to the invention, such a structure has not been developed.

SUMMARY OF THE INVENTION

In view of the foregoing and other problems, drawbacks, and disadvantages of the conventional methods and structures, it is an object of the present invention to provide a memory storage device (and method of forming the same), the active part of which is a metal oxide insulator thin film containing one or more constituent metals, which is connected to two electrodes.

In a first aspect of the invention, a data storage element (and method of forming the same) includes a substrate comprising a semiconductor material, a metal oxide layer comprising an electrically insulating rare earth metal oxide disposed upon a surface of the substrate, a conductive material disposed upon the metal oxide layer, a first electrode electrically connected to the conductive material, and a second electrode connected to the substrate.

In a second aspect, a data storage element includes a substrate including a semiconductor material having a source region and a drain region formed in a surface of the substrate, a layer of metal oxide disposed upon the surface of the substrate and between the source region and the drain region, the metal oxide including at least one metal which has a plurality of oxidation states, a conductive layer disposed upon the layer of metal oxide, a first electrode electrically connected to the conductive layer, a second electrode connected to the source region, and a third electrode connected to the drain region.

In a third aspect, a memory includes a rare-earth based memory element using hysteresis and current-voltage characteristics thereof to store data.

In an exemplary implementation, the metal oxide may be a compound lanthanum oxide and a mixed lanthanum aluminum oxide.

With the invention, when a voltage is applied between the electrodes, beyond a threshold voltage, charge is accumulated in the film, giving rise to a shift in the current voltage and capacitance voltage characteristics. Upon reversal of this voltage, beyond a certain threshold, the charge in the film is discharged, leading to the original I-V and C-V requirements being restored.

With the novel structure of the invention, as compared to the conventional structures described above, charging voltage requirements are low (<7V), charge retention times are long, and the processing technology is compatible with standard CMOS processing such as aluminum metallurgy.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 2:
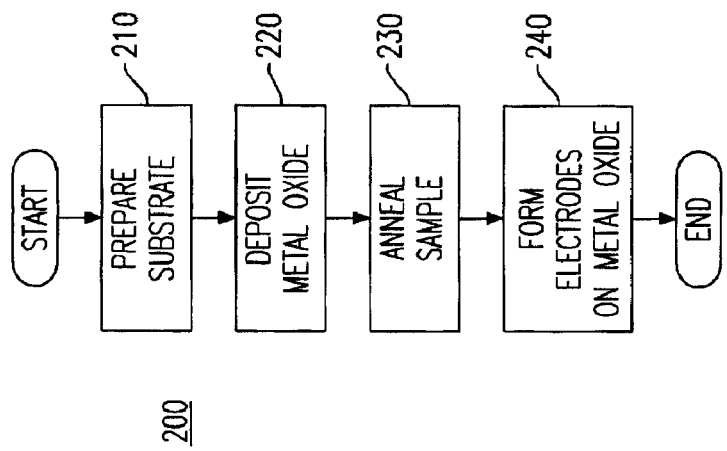
FIG. 2 illustrates a flowchart of a method 200 of forming the inventive structure according to the present invention.

Referring now to the drawings, and more particularly to FIGS. 1–9, there are shown preferred embodiments of the method and structures according to the present invention.

Figure 1:
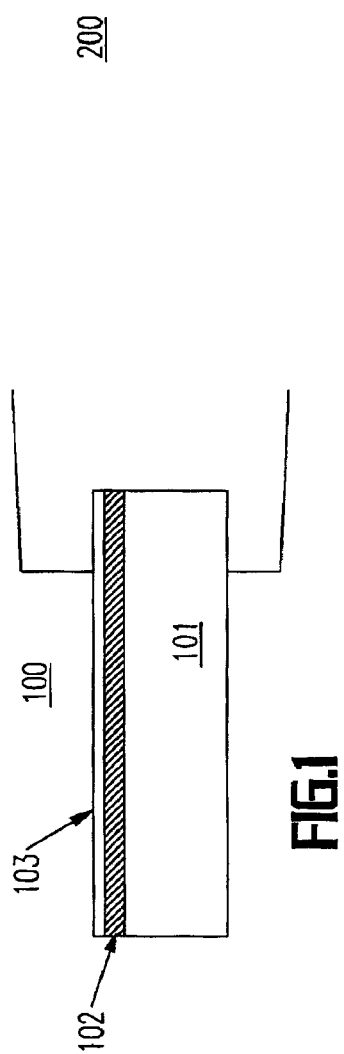
FIG. 1 illustrates a structure 100 according to the present invention.

Turning now to FIG. 1, a structure of a memory element 100 of the present invention is shown.

In FIG. 1, the inventive structure includes a substrate 101 (e.g., silicon or the like). A metal oxide gate 102 is formed on the surface of the substrate 101 and an electrode 103 made of metal, a heavily doped semiconductor or the like (e.g., aluminum, polysilicon, etc.) is formed on the metal oxide.

Preferably, the film 102 is formed of a lanthanum oxide, lanthanum aluminum oxide, or any other rare earth oxide (including Yttrium oxide) or rare earth oxide mixed in with another host oxide deposited onto a silicon wafer. Film thicknesses can be in the range of about 10 Å to about 10,000 Å and more particularly from about 50 Å to about 500 Å. In a practical implementation, the metal oxide layer was formed to have a thickness in a range of about 15 to about 18 nm.

In the inventive process 200 (as shown in FIG. 2), first in step 210, the substrate (e.g., silicon substrate 101) is taken/prepared.

In step 220, the metal oxide film (e.g., film 102) is deposited on the substrate 101. Any deposition technique can be used. In a practical implementation, the deposition was performed by molecular beam deposition where an atomic oxygen beam along with a lanthanum and aluminum beam were directed on a Si sample (e.g., the substrate 101) in an ultra high vacuum chamber at approximately 550 C.

After deposition, in step 230, the sample was annealed in forming gas at approximately 550 C.

Then, in step 240, aluminum electrodes (e.g., electrode 103) were evaporated onto the front side of the structure. The doped Si wafer (e.g., substrate 101) was used as the bottom electrode. The completed structure of the inventive memory element 100 is as shown in FIG. 1.

Preferably, the metal oxide layer is lanthanum oxide or lanthanum-aluminum oxide. This oxide layer can be homogeneously mixed in with a host oxide such as silicon oxide, or sandwiched between layers of the host oxide.

As shown in the graphs of FIGS. 4–8 described below, as the voltage exceeds a threshold voltage (>4 V), the film accumulates charge and on ramping the voltage down, there is a shift in the current minima (e.g., as the device goes from inversion to depletion to accumulation) as a function of voltage due to the change in the internal field as a result of the charging.

The metal oxide film (e.g., 102) can be discharged on reversing the voltage and then, as can be observed, the position of the quasistatic dip returns to its original value. The device can be flipped continuously without deterioration or shift in the I-Vs (current voltages). The charging time at 6.2V is about 3 ms. Charging occurs from about 3.5 V, but charging/discharging times are much longer. Charge retention times were measured to be as long as 12 hours.

Figure 5:
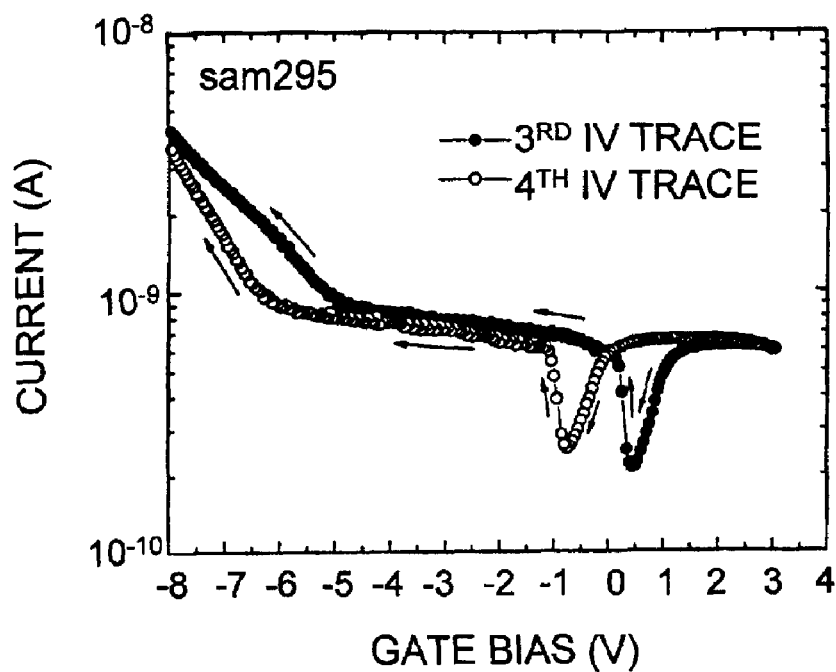

FIG. 5 (described in further detail below) shows the C-V (capacitance voltage) characteristics and the hysteresis shows the charging of the film. It is believed that the charging/discharging of the film is due to the switching of some of the La ions between different oxidation states (i.e., from La+2 to La+3 and vice versa). Thus, other metals (e.g., Ce, Pr, etc.) with multiple oxidation states should also work. The flipping is due to the redox reactions. La+3+e La+2, and La+3+h=La+2, as electrons and holes are injected into the thin film. These La ions could be ions in their substitutional site, or ions in positions that could be characterized as defects, or ions that form complexes with other defects. Such an insulator could be used as a gate of a transistor that would form a read/write memory element, as shown in FIG. 3.

Figure 3:
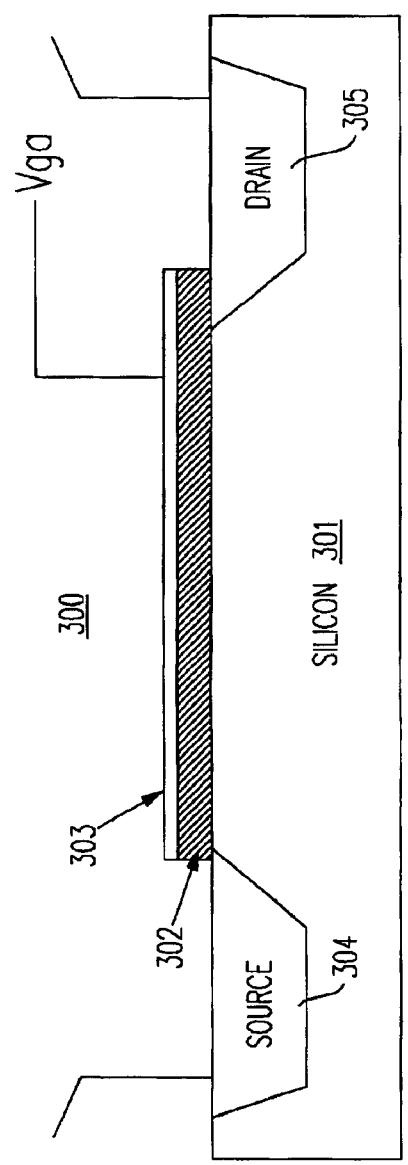
FIG. 3 illustrates another structure 200 according to the present invention.

That is, FIG. 3 illustrates another example of the structure of the inventive memory element 300 which includes a substrate 301 (e.g., silicon or the like) in which source and drain regions 304, 305 have been formed. A metal oxide gate 302 is formed on the surface of the substrate 301 between the source and drain regions 304, 305. An electrode 303 is subsequently formed on the metal oxide layer 302.

FIGS. 4–8 illustrate the switching behavior of the material. That is, in FIG. 4, two current-voltage (I-V) traces measured on an Al gate capacitor with an area of 5×10−3 cm² are shown.

These traces were measured with a ramp rate of 0.1 V/sec. The first trace with solid (dark) symbols shows a dip in the current located at about −1.25 V. The dip occurs in the voltage range where the silicon substrate (e.g., substrates 101, 301) goes from inversion through depletion into accumulation. At +3 V, the current starts to sharply increase above the value of the roughly constant charging current of the capacitor given by C*dV/dt, where C is the capacitance. Then, the current levels off again around −4V before increasing exponentially above about 5V.

Figure 4:
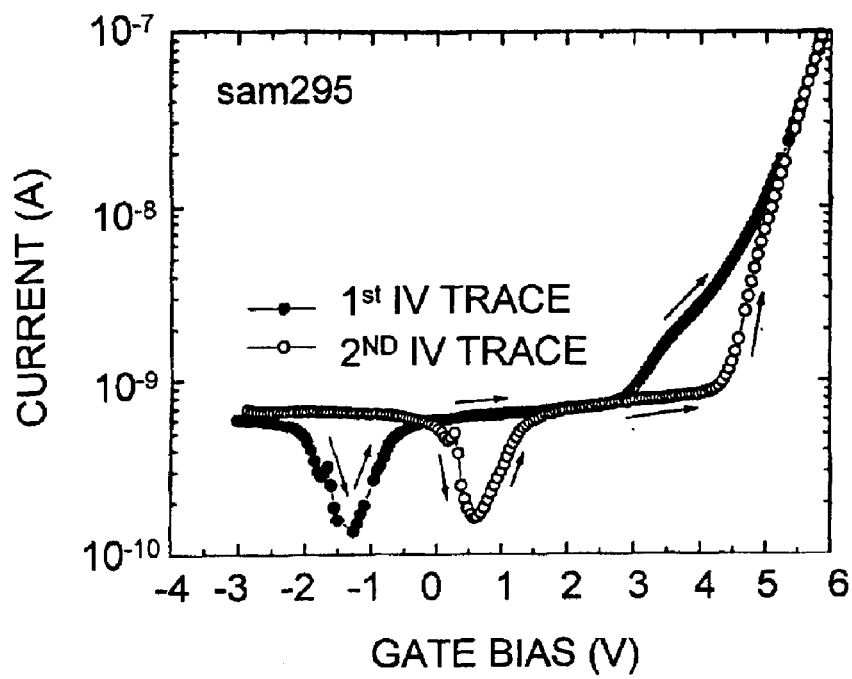
FIGS. 4–9 are graphs illustrating the switching behavior of the material.

After the first I-V trace, a second trace is measured as shown by the open symbols. Two main differences can be observed. First, the dip due to the silicon capacitance is shifted to −0.5 V and the current increase at +3V with the leveling around 4 V is completely absent. The current sharply rises at about 4.5 V and follows an exponential behavior. FIG. 4 clearly shows that a switching behavior in the capacitance voltage characteristics (in this Figure measured as a dip in the current) from −1.25 V to 0.75 V has occurred.

In FIG. 5, two additional current-voltage (I-V) traces measured on the same capacitor as used for taking the data in FIG. 4 are shown. These traces were measured with a ramp rate of −0.1 V/sec. The absolute magnitude of the current is shown in FIG. 4 because all currents are negative. (Since the measurements were performed with n-type silicon, the sample was exposed to white light during the measurements. This was done to enhance minority carrier generation and to prevent the silicon from going into deep depletion. Other methods can be used to achieve that same effect such as implanting the silicon surrounding the capacitor with n-type dopants.)

The third trace shown with solid (dark) symbols again shows a dip in the current located at about −1.25 V. The dip occurs in the voltage range where the silicon substrate goes from accumulation through depletion into inversion. At −5.5 V, the current starts to sharply increase above the value of the roughly constant charging current of the capacitor given by C*dV/dt, where C is the capacitance. The current then levels off again around +7 V before increasing again about −7.5 V.

After the third trace, a fourth I-V trace is measured as shown by the open symbols. Two main differences can be observed.

First, the dip due to the silicon capacitance is shifted to about −1.0 V and the current increase at −5.5 V with the leveling around −7 V is completely absent. The current sharply rises at about −7.0 V and follows an exponential behavior.

FIG. 5 clearly shows that a switching behavior in the capacitance voltage characteristics (in FIG. 5 measured as a dip in the current) from about 0.75 V to −1.0 V has occurred.

Combining the results FIG. 4 and FIG. 5, it can be seen that the capacitance voltage characteristics can be switched from about −1 V to about +1 V with such current ramp experiments reversibly (i.e., the capacitance value at a certain voltage can be controllably placed at one of two different values). As a result, this device can be used as a memory device.

Figure 6:
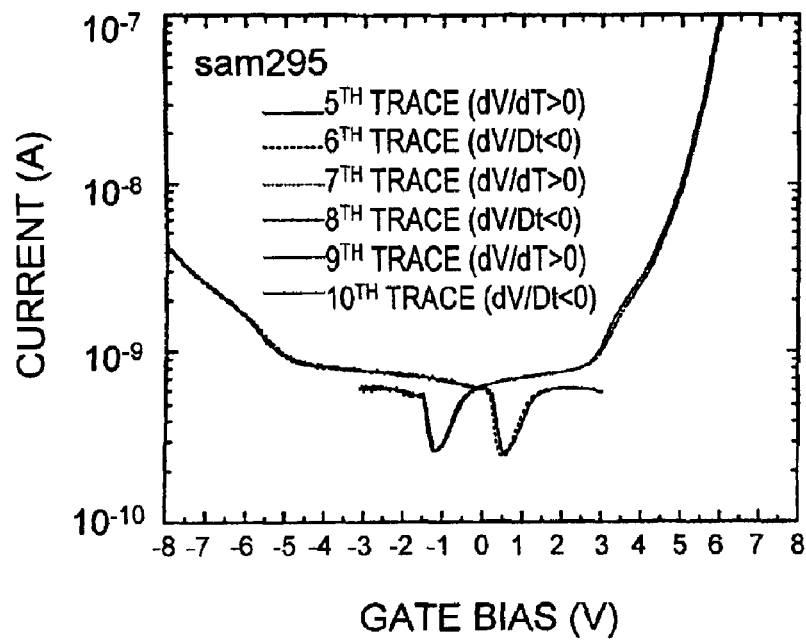

In FIG. 6, traces 5 through 10 are shown. Here, the direction has been altered from trace to trace to show application to a memory usage. As can be seen, all traces with dV/dt>0 display the dip due to the silicon surface capacitance at about −1V, while all the traces with a dV/dt<0 display the dip due to the silicon surface capacitance at −0.75 V. Repeated switching is possible by alternating the voltage ramp from positive to negative voltages.

Figure 7:
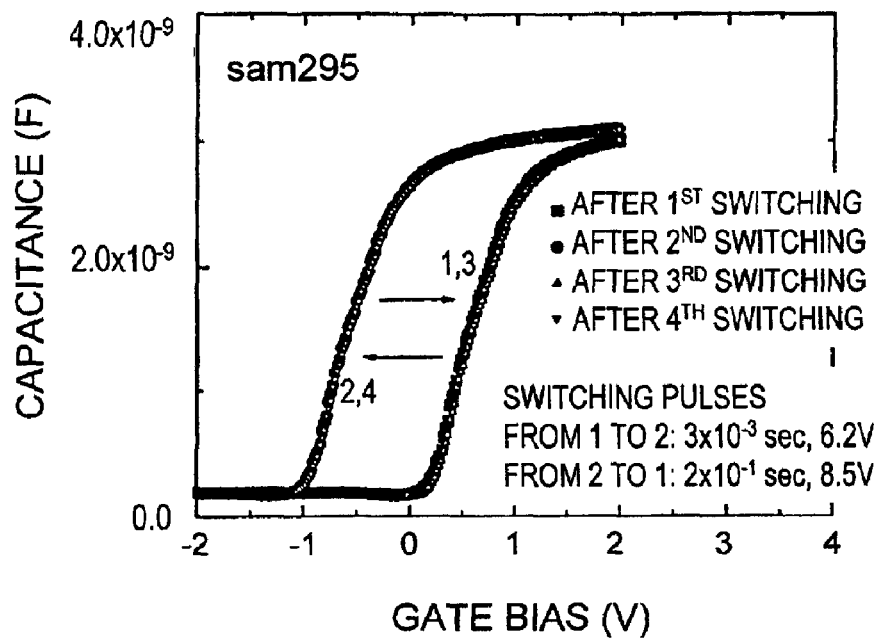

FIG. 7 illustrates that this switching behavior can also be observed by applying voltage pulses to the capacitor structure. In this case, the high frequency capacitance voltage characteristics was measured after applying a positive pulse of 6.2 V with a width of 0.003 sec to a fresh capacitor (e.g., shown by solid squares in FIG. 7).

Then, a negative pulse of −8.5 V of 0.2 sec was applied and the capacitance voltage characteristics shown by the solid circles was measured. The up triangles show the C-V trace after a second (3rd switching) positive pulse as described above. Then, the C-V was measured after a second negative pulse.

Figure 8:
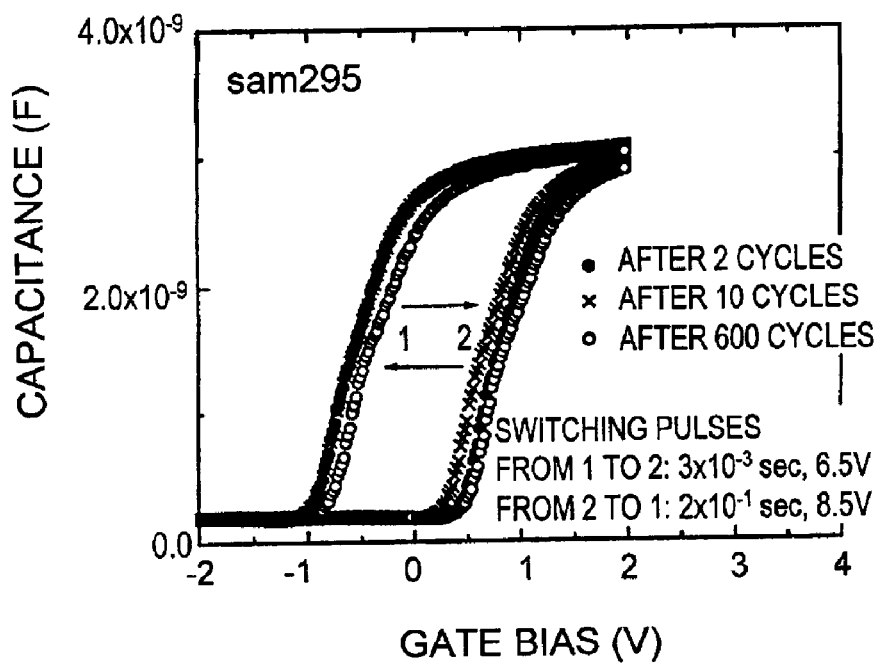

FIG. 8 shows that the switching of the CV characteristics can be maintained over repeated cycles (e.g., positive and negative pulses as described above) over a number of cycles.

Figure 9:
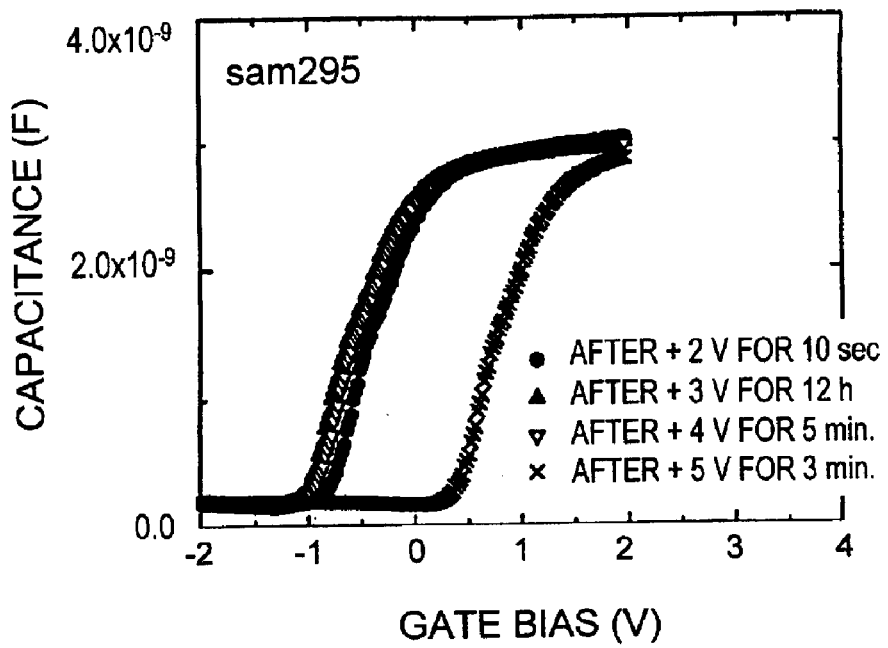

FIG. 9 shows that the structure stays in the switched state for extended periods of time. The solid circles show the C-V measured 10 sec. after applying a negative pulse. During that time the device was held at +2 V. Traces were measured after holding the structure at +3 V for 12 h, +4 V for 5 min and +5 V for 3 min. As can be seen, at voltages of less than 3 V, no significant shift in the CV curve occurs within 12 hours. Only at higher voltages (+5 V for 3 min.) is the device switched to the position observed after applying a positive pulse as described above.

With the unique and unobvious features of the present invention, a non-volatile memory (and method of forming the memory) is provided where the charging voltage requirements are low (<7V), charge retention times are long, and the processing technology is compatible with standard CMOS processing such as aluminum metallurgy. As a result, when a voltage is applied between the electrodes, beyond a threshold voltage, charge is accumulated in the film, giving rise to a shift in the current voltage and capacitance voltage characteristics. Upon reversal of this voltage, beyond a certain threshold, the charge in the film is discharged, thereby leading to the original I-V and C-V requirements being restored.

While the invention has been described in terms of preferred embodiments, those skilled in the art will recognize that the invention can be practiced with modification within the spirit and scope of the appended claims.

What is claimed is:

1. A data storage element, comprising:
   a substrate comprising a semiconductor material;
   a metal oxide layer comprising an electrically insulating rare earth metal oxide disposed upon a surface of said substrate, said metal oxide layer having a thickness in a range from 50 Å to 500 Å and forming an active element of said data storage element;
   a conductive material disposed upon said metal oxide layer;
   a first electrode electrically connected to said conductive material; and
   a second electrode connected to said substrate.

2. The data storage element as set forth in claim 1, wherein said metal oxide comprises lanthanum oxide.

3. The data storage element as set forth in claim 1, wherein said metal oxide comprises a mixture of lanthanum oxide and aluminum oxide.

4. The data storage element as set forth in claim 3, wherein said conductive material comprises metallic aluminum.

5. The data storage element as set forth in claim 1, wherein said metal oxide comprises at least one of:
   lanthanum oxide, and
   a mixture of lanthanum oxide and aluminum oxide, and said conductive material comprising metallic aluminum.

6. The data storage element as set forth in claim 1, wherein said metal oxide oxide layer has a thickness in a range of 150 Angstroms to 180 Angstroms.

7. The data storage element according to claim 1, wherein said conductive material comprises polysilicon.

8. The data storage element according to claim 1, wherein said conductive material comprises Aluminum.

9. The data storage element of claim 1, wherein the metal oxide layer changes internally as a function of an applied voltage.

10. The data storage element of claim 1, wherein when a voltage is applied between the first and second electrodes, beyond a threshold voltage, charge is accumulated in the metal oxide layer, thereby shifting current-voltage and capacitance-voltage characteristics, and
    wherein upon reversal of the applied voltage, beyond a second threshold voltage, the charge in the metal oxide layer is discharged, thereby restoring original current-voltage and capacitance-voltage requirements.

11. The data storage element as set forth in claim 1, wherein said data storage element comprises a charging voltage requirement of less than 7V.

12. The data storage element as set forth in claim 1, wherein said metal oxide layer is formed directly on said substrate and said conductive material is formed directly on said metal oxide layer.

13. The data storage element as set forth in claim 1, wherein said data storage element comprises a charge retention time of at least 12 hours.

14. The data storage element as set forth in claim 1, further comprising:
    a host oxide layer, said rare earth metal oxide layer homogeneously mixed with said host oxide layer.

15. The data storage element as set forth in claim 1, further comprising:
    a plurality of host oxide layers, said rare earth metal oxide layer being formed between said plurality of host oxide layers.

16. The data storage element as set forth in claim 1, wherein rare earth metal oxide layer comprises one of a cerium oxide layer, a yttrium oxide layer, and a praseodymium oxide layer.

17. A data storage element, comprising:
    a substrate comprising a semiconductor material having a source region and a drain region formed in a surface of said substrate;
    a layer of metal oxide disposed upon said surface of said substrate and between said source region and said drain region, said metal oxide comprising at least one metal which has a plurality of oxidation states, said metal oxide layer having a thickness in a range from 50 Å to 500 Å and forming an active element of said data storage element;
    a conductive layer disposed upon said layer of metal oxide;
    a first electrode electrically connected to said conductive layer;
    a second electrode connected to said source region; and
    a third electrode connected to said drain region, to form said data storage element.

18. A data storage element as set forth in claim 17, wherein said semiconductor material comprises n-doped silicon, said metal oxide comprising at least one of lanthanum oxide and a mixture of lanthanum oxide and aluminum oxide, and said conductive layer comprising metallic aluminum.

19. The data storage element as set forth in claim 17, wherein said semiconductor material comprises n-doped silicon.

20. The data storage element as set forth in claim 17, wherein said metal oxide comprises at least one of lanthanum oxide, and a mixture of lanthanum oxide and aluminum oxide.

21. The data storage element as set forth in claim 17, wherein said conductive layer comprises metallic aluminum.

22. The data storage element of claim 17, wherein the metal oxide layer changes internally as a function of an applied voltage.

23. The data storage element of claim 17, wherein when a voltage is applied between the first and second electrodes, beyond a threshold voltage, charge is accumulated in the metal oxide layer, thereby shifting current-voltage and capacitance-voltage characteristics, and wherein upon reversal of the applied voltage, beyond a second threshold voltage, the charge in the metal oxide layer is discharged, thereby restoring original current-voltage and capacitance-voltage requirements.

24. A memory, comprising:
a rare-earth based memory element for storing data based on hysteresis and current-voltage characteristics thereof, said rare-earth based memory element comprising:
a metal oxide layer comprising an electrically insulating rare earth metal oxide disposed upon a surface of said substrate, said metal oxide layer having a thickness in a range from 50 Å to 500 Å and forming an active element of said rare-earth based memory element.

25. The memory as set forth in claim 24, wherein said memory element further comprises:
a conductive material disposed upon said metal oxide layer.

26. The memory as set forth in claim 25, wherein said metal oxide comprises lanthanum oxide.

27. The memory as set forth in claim 25, wherein said metal oxide comprises a mixture of lanthanum oxide and aluminum oxide.

28. The memory as set forth in claim 27, wherein said conductive material comprises metallic aluminum.

29. The memory as set forth in claim 25, wherein said metal oxide comprises at least one of:
lanthanum oxide, and
a mixture of lanthanum oxide and aluminum oxide, and said conductive material comprising metallic aluminum.

30. The memory as set forth in claim 25, wherein said substrate comprises n-doped silicon, said metal oxide comprising at least one of lanthanum oxide and a mixture of lanthanum oxide and aluminum oxide, and said conductive material comprising metallic aluminum.

31. The memory of claim 24, wherein said memory element comprises a metal oxide layer on a substrate, and
wherein the metal oxide layer changes internally as a function of an applied voltage.

32. The memory of claim 24, wherein when a voltage is applied to said memory, beyond a threshold voltage, charge is accumulated in the memory element, thereby shifting current-voltage and capacitance-voltage characteristics, and
wherein upon reversal of the applied voltage, beyond a second threshold voltage, the charge in the memory is discharged, thereby restoring original current-voltage and capacitance-voltage requirement.

33. A memory element, comprising:
a rare earth metal oxide layer having a thickness in a range from 50 Å to 500 Å and formed on a semiconductor substrate; and
an electrode formed on said rare earth metal oxide layer.

* * * * *